(12) United States Patent
Fujiwara

(10) Patent No.: US 6,727,773 B2
(45) Date of Patent: Apr. 27, 2004

(54) METHOD OF GENERATING A CLOCK, A CLOCK GENERATION DEVICE, AND ELECTRONIC APPARATUSES HAVING A CLOCK GENERATION DEVICE

(75) Inventor: Masayu Fujiwara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 17 days.

(21) Appl. No.: 10/145,241

(22) Filed: May 13, 2002

(65) Prior Publication Data

US 2002/0171457 A1 Nov. 21, 2002

(30) Foreign Application Priority Data

May 15, 2001 (JP) ........................................ 2001-144300

(51) Int. Cl.[7] .............................................. H03C 3/06
(52) U.S. Cl. ........................................ 332/127; 332/117
(58) Field of Search ................................ 332/127, 119, 332/117, 138; 375/373, 376, 294, 327

(56) References Cited

U.S. PATENT DOCUMENTS 6,079,253 A * 6/2000 Bonne et al. ............... 73/61.76
6,137,995 A * 10/2000 Durec et al. ................... 455/75
6,411,073 B1 * 6/2002 Fischer et al. ................ 324/66
6,546,060 B1 * 4/2003 Kawai ......................... 375/303

FOREIGN PATENT DOCUMENTS

JP       05-090987       4/1993

* cited by examiner

*Primary Examiner*—Timothy P. Callahan
*Assistant Examiner*—Cassandra Cox
(74) *Attorney, Agent, or Firm*—Hogan & Hartson

(57) ABSTRACT

In generating a frequency-modulated clock, a first frequency modulation (FM) signal having frequency fm1 is frequency-modulated by a second FM signal having a second frequency fm2, generating a clock modulation signal fm0. The clock generation signal fm0 is used to frequency-modulate the system clock CLK by the clock modulation signal fm0. Thus, the spectrum of the clock is doubly dispersed by the first and the second FM frequencies. As a result, peak levels at the fundamental and higher harmonic frequencies are reduced as compared with conventional clock generation device.

2 Claims, 9 Drawing Sheets

METHOD OF GENERATING A CLOCK, A CLOCK GENERATION DEVICE, AND ELECTRONIC APPARATUSES HAVING A CLOCK GENERATION DEVICE

FIELD OF THE INVENTION

The invention relates to a method of generating a clock, a clock generation device, and electronic apparatuses having such clock generation device.

BACKGROUND OF THE INVENTION

Many electronic apparatuses employ microprocessors and other digital devices that require high-frequency clock signals. These fast digital devices are very sensitive to electromagnetic interference (EMI). A clock normally contains significant levels of EMI components at the fundamental and higher harmonic frequencies thereof.

Therefore, it is necessary that an electronic apparatus be designed to operate properly even under interferential electromagnetic waves. A standard of permissible EMI has been set forth for electronic apparatuses, so that electronic apparatuses be designed and manufactured to comply with the standard.

To do this, various structural improvements have been made to shield and/or minimize interferential electromagnetic radiation. These measures, however, require many extra parts and hence manufacturing steps, thereby rendering the manufactures costly.

Japanese Patent Application JP-A-5-90987 discloses a method of frequency-modulating a clock to generate a modulated clock having reduced levels of spectral components at the clock and higher harmonic frequencies. FIG. 1 is a block diagram representation of the method as mentioned above, showing its concept. FIGS. 2 and 3 show spectra of the clock and of the frequency-modulated clock.

In the example shown in FIG. 1, a clock generator 1 generates a clock CLK having a predetermined frequency fc. An FM signal generator 2 generates a square wave frequency modulation (FM) signal fm, which is fed to the clock generator 1 to frequency-modulate the clock signal CLK about the frequency fc.

Through such frequency modulation, the peak at frequency fc (dominant mode) of the clock will be dispersed into different components having reduced levels and spread about the frequency fc as shown in FIG. 3. The reduction in the level of the fundamental mode can be clearly seen by comparing the frequency-modulated spectrum with the non-modulated spectrum of the clock shown in FIG. 2. Thus, the EMI arising from the respective peaks will be reduced accordingly. The frequency fc can be the clock frequency or any other higher harmonic frequency of the clock.

In this conventional approach, EMI is reduced by the spectral dispersion of a peak at a given frequency fc through frequency modulation of the dominant peak. However, the degree of reduction of the peak depends on the range (or width) of the dispersion about the frequency fc. However, since the clock is a time basis of operation of the electronic apparatus, the frequency modulation is permissible only within a limited range where the dispersed modes will not disadvantageously affect the clock operation. Therefore, the range of frequency modulation cannot be made very large.

SUMMARY OF THE INVENTION

It is therefore an object of the invention to provide a method and a device for generating a clock which is frequency-modulated only in a limited range such that the modulated clock has a dispersed spectrum having sufficiently reduced levels at the fundamental and higher harmonic frequencies.

In accordance with one embodiment of the invention, there is provided a method of generating a clock, comprising steps of:

frequency-modulating a first signal having a first frequency by a second signal having a second frequency to generate a clock modulation signal; and frequency modulating the clock by the clock modulation signal to thereby generate a doubly frequency-modulated clock in a predetermined range.

In accordance with another aspect of an embodiment of the invention, there is provided a clock generation device and an electronic apparatus utilizing such clock generation device, said clock device comprising:

a clock generation device having a clock generator for generating a clock having a predetermined frequency, said clock generation device adapted to receive a frequency modulation (FM) signal;

a modulation signal generator for generating a clock modulation signal by generating a first and a second FM signals having a first and a second frequencies, respectively, and by frequency-modulating said first FM signal by said second FM signal, wherein said clock modulation signal is supplied to said clock generator to thereby frequency-modulate said clock to generate a doubly frequency-modulated clock having a range of frequencies.

In the present invention, the clock is doubly frequency-modulated in that the original system clock CLK is modulated by the clock modulation signal fm0 which is obtained from the first frequency modulation (FM) signal having frequency fm1 by frequency-modulating it by the second FM signal having frequency fm2. As a result, after dispersed in frequency by the first FM signal, the spectrum of the clock is again dispersed by the second FM signal. Consequently, peak levels of the components at the fundamental and higher harmonic frequencies of the clock are reduced greatly as compared with a conventional clock, thereby reducing its EMI to other electronic apparatus.

It should be appreciated that the range, fmax–fmin, of the frequency modulation of the clock used as the time-base of the system need not be large in order to reduce the EMI. In fact, it can be done in a rather narrow frequency range. This implies that the inventive clock generation will not disadvantageously affect the operations of other electronic apparatuses.

The clock modulation signal can be a signal having a successive triangular waveform (hereinafter referred to as triangular wave signal) or a signal having a sinusoidal waveform (hereinafter referred to as sinusoidal wave signal).

Further, the first signal can be a triangular/sinusoidal wave signal, while the second signal can be another triangular/sinusoidal having a lower frequency than the first signal.

This renders the spectral distribution of the frequency-modulated clock substantially flat, which causes much less EMI to other neighboring digital devices. The FM signal generators for generating the triangular/sinusoidal wave signals can be easily formed as two electronic devices on the same IC board as the clock generator, without any appreciable cost.

The clock generator can be a phase-locked loop (PLL) circuit that includes a variable frequency divider and a voltage-controlled oscillator (VCO). The clock modulation signal can be supplied to the variable frequency divider and the voltage controlled oscillator.

In these arrangements, the frequency-modulated clock modulation signal is supplied to the PLL circuit as a voltage control signal to control the frequency division, or to the VCO as a voltage control signal to control the input voltage or the voltage-controlled capacitance thereof. This permits smooth frequency-modulation of the clock.

DETAILED DESCRIPTION OF THE PREFERRED EMBODIMENT

Figure 4:
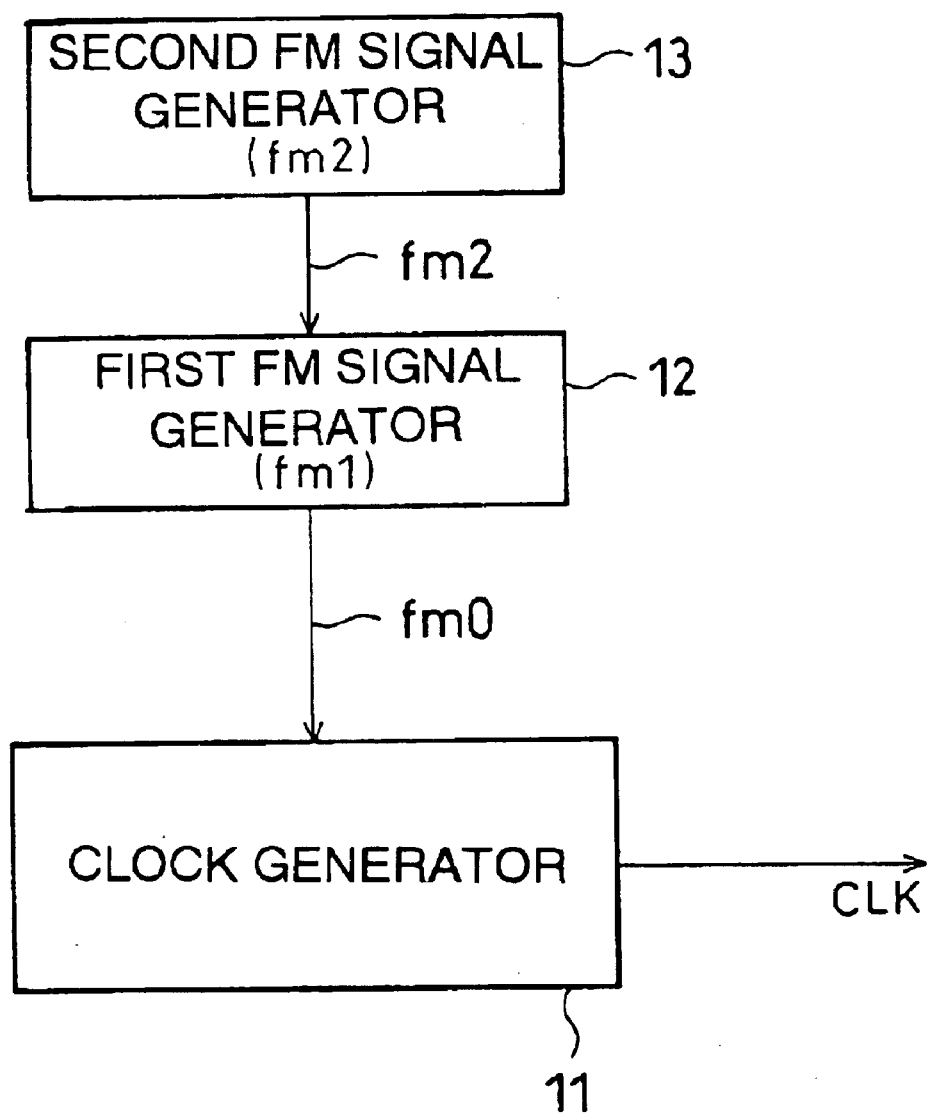
FIG. 4 is a schematic diagram showing the concept of a clock generation device according to the invention.
Figure 5A:
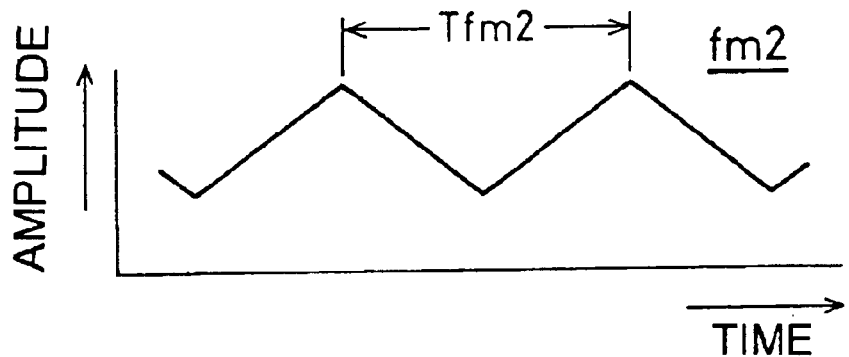
FIGS. 5A–5C show FM signals for the clock generation device shown in FIG. 4.
Figure 5B:
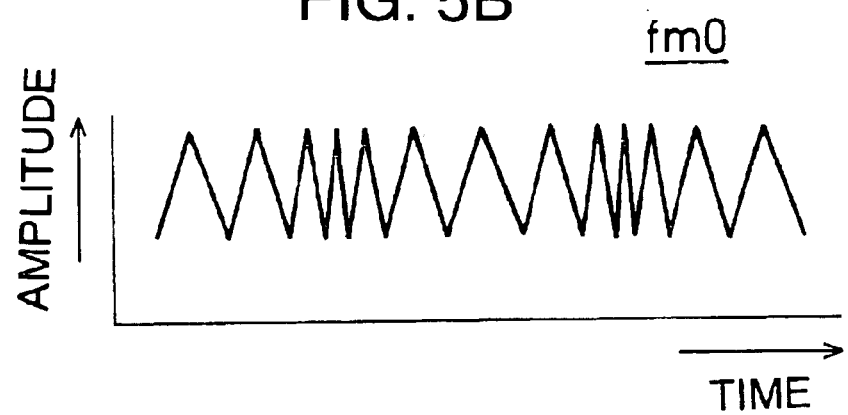
Figure 5C:
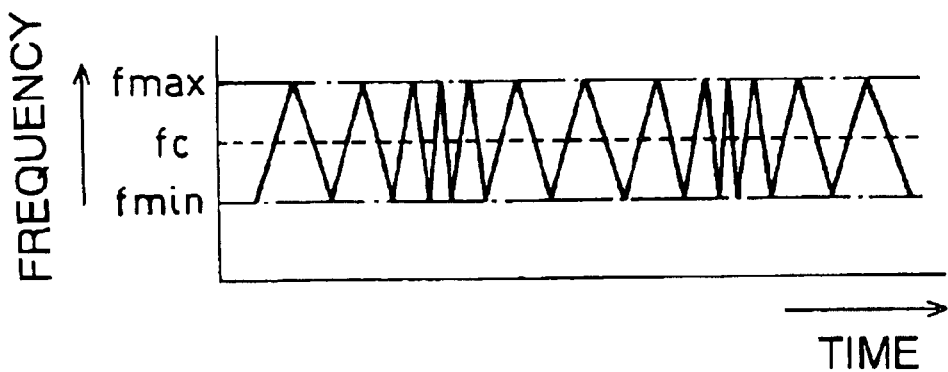

Referring now to FIG. 4, there is shown a clock generation device according to the invention, in which a doubly frequency-modulated clock having frequencies in a predetermined range of frequency is generated from a clock having a predetermined frequency through frequency modulations of the clock by first and second triangular FM signals having a first and a second frequency, respectively. FIGS. 5A–5C show the waveforms of the first and second FM signals along with the frequency-modulated clock.

As shown in FIG. 4, a clock generator 11 generates a square or trapezoidal wave clock having a predetermined frequency fc (e.g. 10 MHz). Specifically, the generator can be an ordinary PLL circuit. A first FM signal generator 12 generates a first triangular wave signal having a constant amplitude and a first frequency fm1 (e.g. 15 kHz). A second FM signal generator 13 generates a second triangular signal having a constant amplitude and a second frequency fm2 (e.g. 1 kHz) which is lower than the first frequency fm1 of the first FM signal.

The second triangular FM signal (see FIG. 5A) generated by the second FM signal generator 13 is provided to the first FM signal generator 12 to frequency-modulate the first triangular signal, resulting in a frequency-modulated clock modulation signal fm0 (see FIG. 5B). This frequency-modulated clock modulation signal fm0 is supplied to the clock generator 11, to thereby frequency modulate the clock having predetermined frequency fc, resulting in a doubly frequency-modulated clock.

Thus, the frequency of the clock CLK as output from the clock generator 11 varies with time in a range from a low frequency fmin to a high frequency fmax, about the frequency fc (referred to as reference frequency) as shown in FIG. 5C. In addition, the period of the variation also changes periodically with time. That is why the clock CLK is said to be doubly frequency-modulated.

Figure 6:
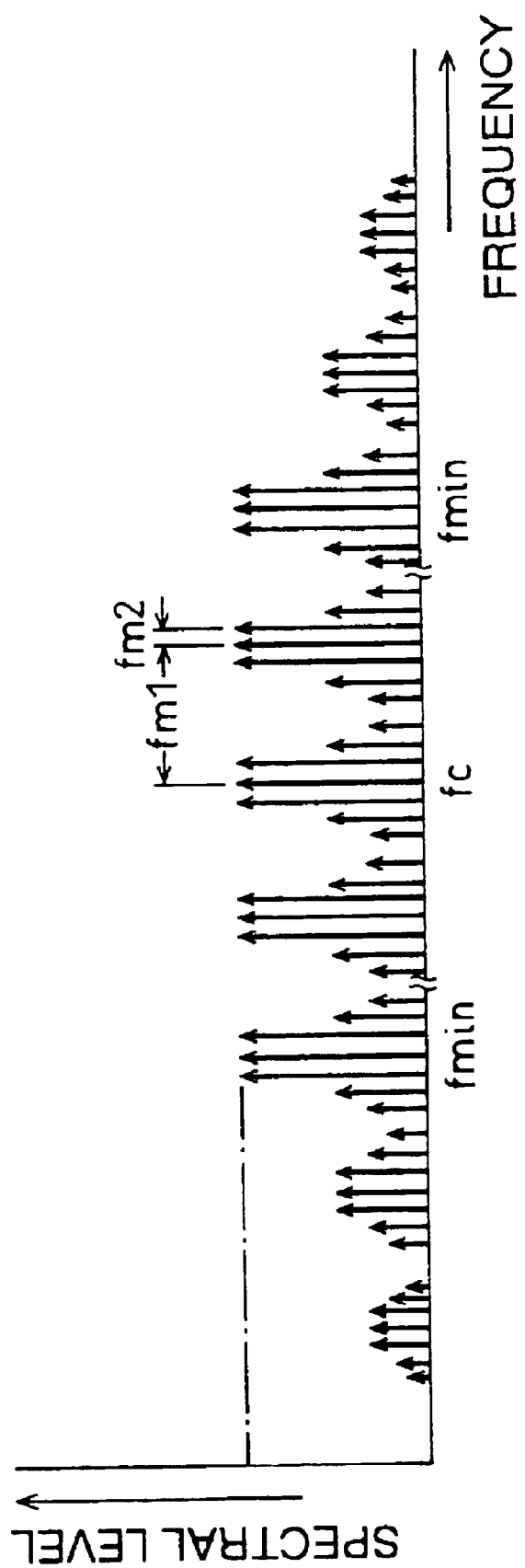
FIG. 6 illustrates a spectrum of the doubly frequency-modulated clock.

The spectrum of the doubly frequency-modulated clock CLK is illustrated in FIG. 6. It is seen in FIG. 6 that the spectrum contains peaks of a constant level centered at the reference frequency fc and distributed at regular intervals (and spaced apart by fm1) between a high frequency fmax and a low frequency fmin. Furthermore, the spectrum contains diminishing components of lower and higher frequencies spreading above and below fmax and fmin, respectively. It is also seen that on both sides of the respective components spaced by the first frequency fm1, are secondary components distributed at regular intervals and spaced apart by the second frequency fm2.

Figure 1:
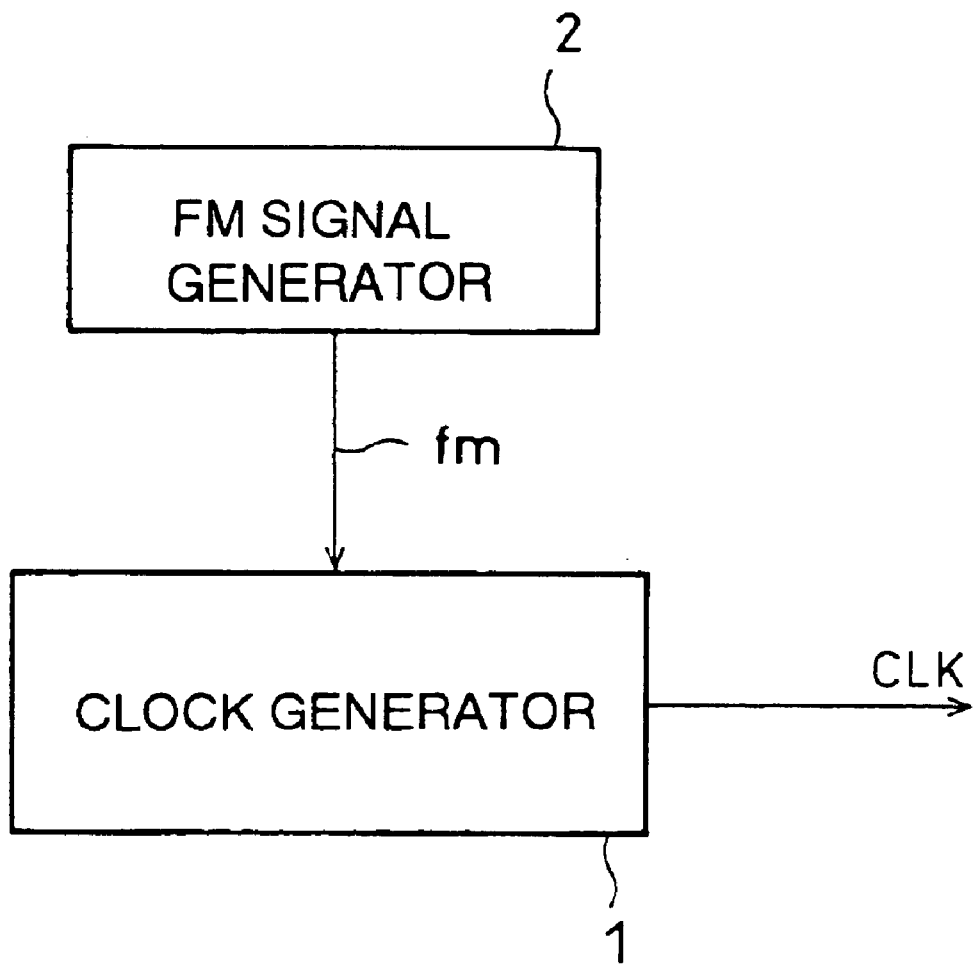
FIG. 1 is a schematic diagram showing the concept of a prior art clock generator.
Figure 2:
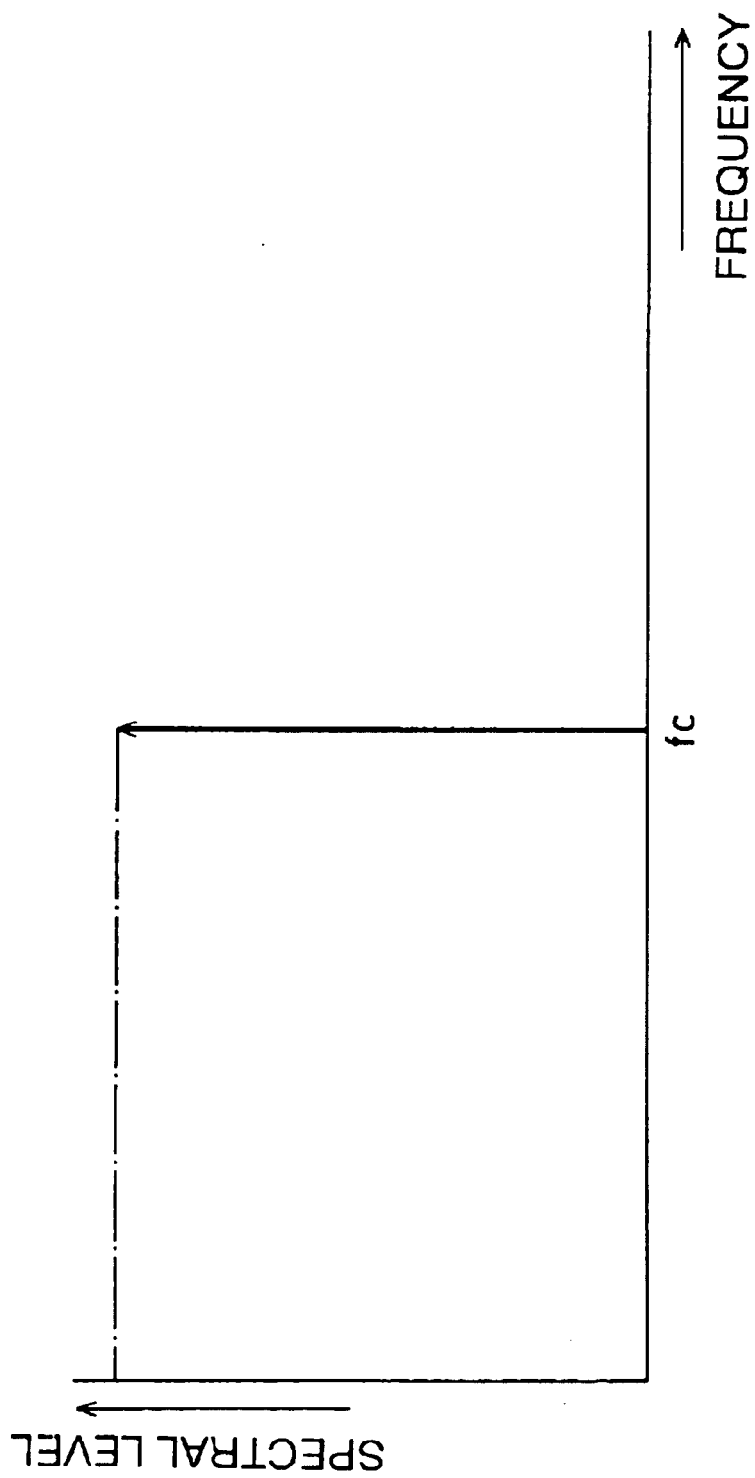
FIG. 2 shows a spectral distribution of the clock without frequency modulation.
Figure 3:
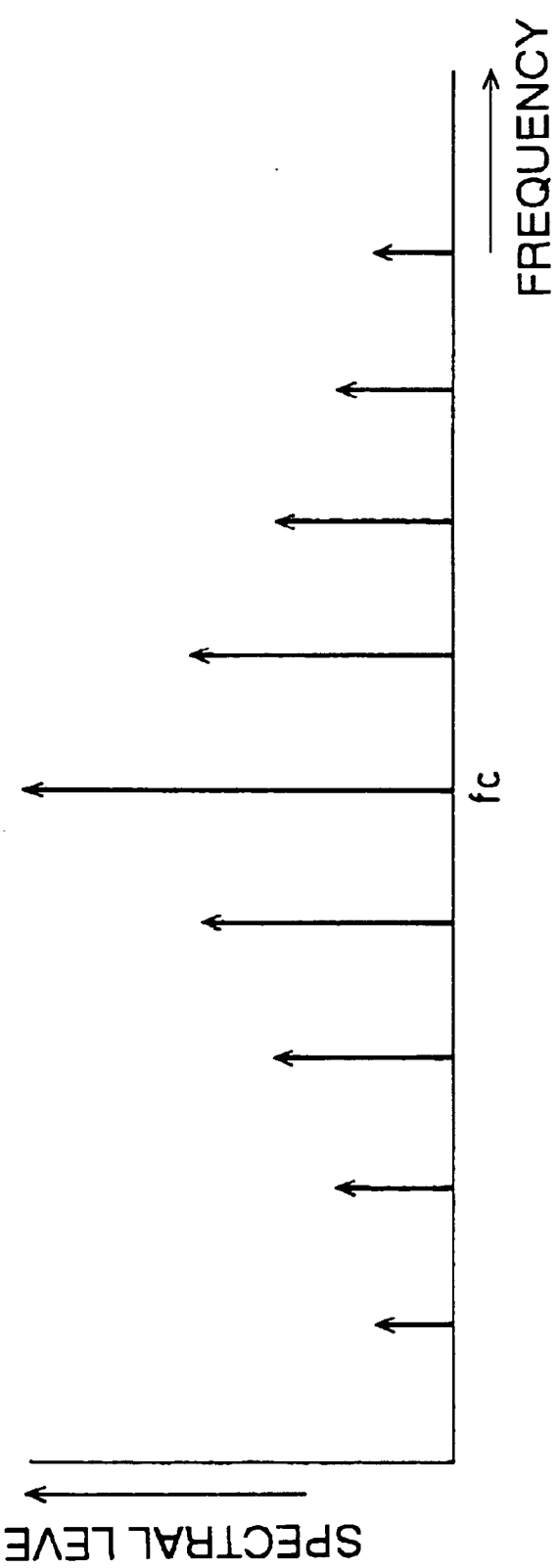
FIG. 3 shows a spectrum of a prior art frequency-modulated clock.

As will be clearly understood by comparing the spectrum shown in FIG. 6 with a conventional spectrum as shown in FIG. 3, a frequency-modulated clock of the invention has a multitude of components distributed at extremely narrow intervals, and accordingly their peak levels are greatly reduced. In the embodiment shown herein, the first and the second FM signals are triangular wave FM signals, which result in a triangular clock modulation signal fm0. The clock modulation signals facilitate flattening the peak levels at the fundamental frequency (i.e. original clock frequency) and higher harmonic frequencies thereof, thereby reducing EMI to other ambient digital apparatuses.

An improvement of FM modulation of a clock attained by the invention can be seen in the following specific example in which the clock having a fundamental frequency of 10 MHz is frequency-modulated by a first triangular wave FM signal of 15 kHz and a second triangular wave FM signal of 1 kHz. The clock will exhibit a higher harmonic at 290 MHz (which is 29th higher harmonic of the fundamental frequency) when frequency-modulated by the first FM signal. After it is doubly frequency-modulated by the first and the second FM signals, the peak level of the higher harmonic is further reduced than that of the first modulated clock by about 5 [dB]. Similar results can be seen also at higher harmonics other than the 29th harmonic.

Because of such exceedingly large reductions in the peak level at all frequencies of the clock spectrum as compared with conventional frequency modulation, EMI to ambient electronic apparatuses is greatly reduced. It would be appreciated that this frequency-modulation can be carried out without enlarging the range fmax-fmin of frequency modulation by the first FM signal about the reference frequency fc. That is, it can be done within the narrow, limited frequency range, and hence it will not appreciably affect the operations of other electronic apparatuses.

The frequency modulation can be alternatively performed using first and second trapezoidal or sinusoidal wave FM signals, in place of triangular wave FM signals. When sinusoidal or trapezoidal wave FM signals are used, reduction of the peak levels at the fundamental and higher harmonic frequencies, and hence flatness of the spectrum, are less reduced as compared with the reduction by the triangular wave FM signals, so that EMI will increase correspondingly. Therefore, sinusoidal or trapezoidal wave FM signals may be used when permissible in the situation under consideration.

Figure 7:
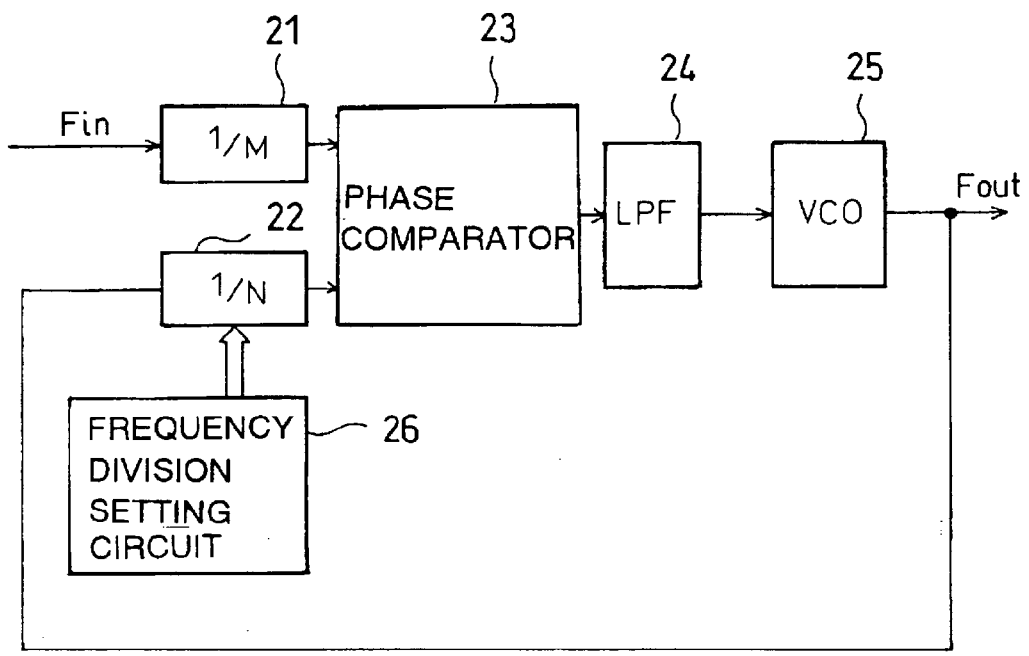
FIG. 7 is a block diagram representation of another clock generation device according to the invention.
Figure 8:
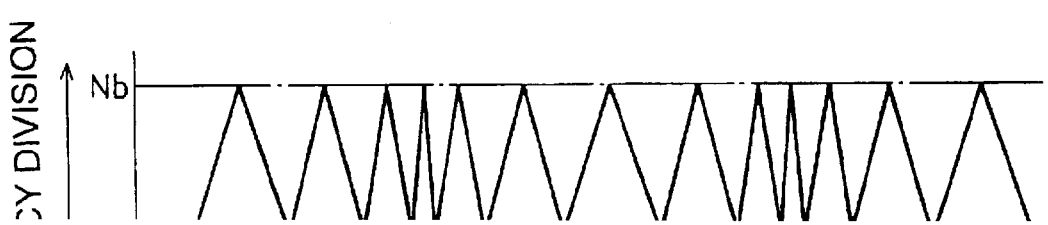
FIG. 8 shows variation of the frequency division performed by the frequency division setting circuit 26 shown in FIG. 7.

FIG. 7 is a block diagram showing details of another clock generation device according to the invention, and FIG. 8 shows a resultant clock modulation signal obtained by the clock generation device.

The clock generation device shown in FIG. 7 is a PLL circuit which divides the frequency Fin of input signal by M by means of a first frequency divider 21 and supplies the frequency-divided signal to one input terminal of a phase comparator 23. The clock CLK output from the clock generation device is further frequency-divided into N frequencies by a second frequency divider 22 and then supplied to the other input terminal of the phase comparator 23. The resultant signal output from the phase comparator 23 is smoothed by a low-pass filter (LPF) 24 before it is fed to a voltage controlled oscillator (VCO) 25 as the voltage control signal therefor. The two signals entering the phase comparator 23 are compared in the PLL circuit, controlling the VCO 25 so as to make the phases of the two input signals in phase with each other. As a result, the frequency of the output signal will become Fin×N/M. The clock CLK is shaped into a desired clock waveform in the VCO 25 before it is output therefrom. This waveform shaping can be done separately in another circuit outside the VCO 25.

The frequency division N performed by the second frequency divider 22 is changed based on an instruction received from a frequency-division setting circuit 26. The change in the frequency-division N is controlled such that the frequency modulation of the first triangular wave FM signal having frequency fm1 by the second triangular wave signal having frequency fm2 as shown in FIGS. 4–6 will result in a desired clock modulation signal fm0.

To do this, the frequency-division setting circuit 26 steps up or down the frequency division N at regular intervals between the minimum division Na and the maximum division Nb as shown in FIG. 8. That is, the division N increases from Na to Nb and decreases from Nb to Na by 1 unit during one period, and then increases from Na to Nb and decreases from Nb to Na by 2 units during the next period when the period T of the FM signal is long enough for the variation. Through such sequential variations of frequency division N of the second FM signal as shown in FIG. 8, the clock modulation signal fm0 is varied as shown in FIG. 5B. Consequently, the output frequency Fout of the clock generation device is doubly modulated in frequency.

In the embodiment shown herein, a change in the frequency division N made in the second frequency divider 22 must be converted to a corresponding change in the control voltage to the VCO 25. Therefore, the LPF 24 is constructed to have adequate frequency characteristics for the conversion.

In the embodiment shown herein, the double frequency modulation of the clock may be carried out by use of a variable frequency divider 22 which is coupled to an ordinary PLL circuit 23 and a frequency division setting circuit 26 which is coupled to the frequency divider 22 to vary the frequency division N of the divider 22 with time by stepping up or down its frequency division N as described above. The frequency division setting circuit 26 can be formed, together with the PLL circuit, as an electronic device integrated in the same IC chip. Hence, the entire clock generation device can be provided in the same chip without any appreciable cost.

Figure 9:
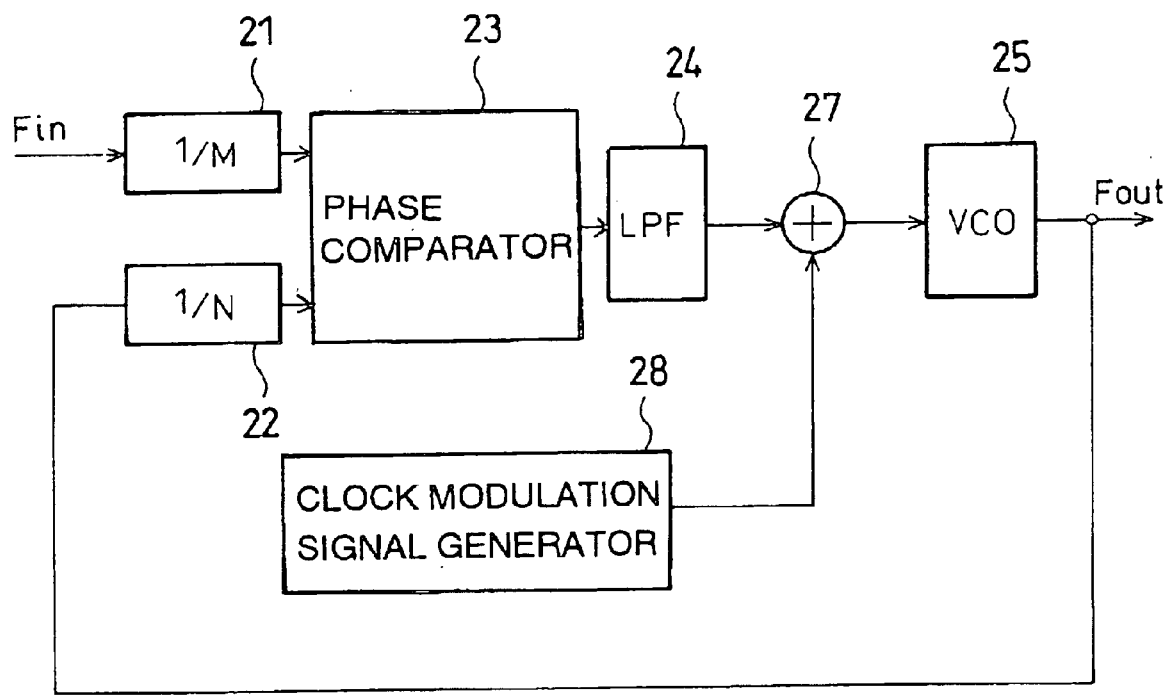
FIG. 9 is a block diagram representation of a further clock generation device according to the invention.
Figure 10:
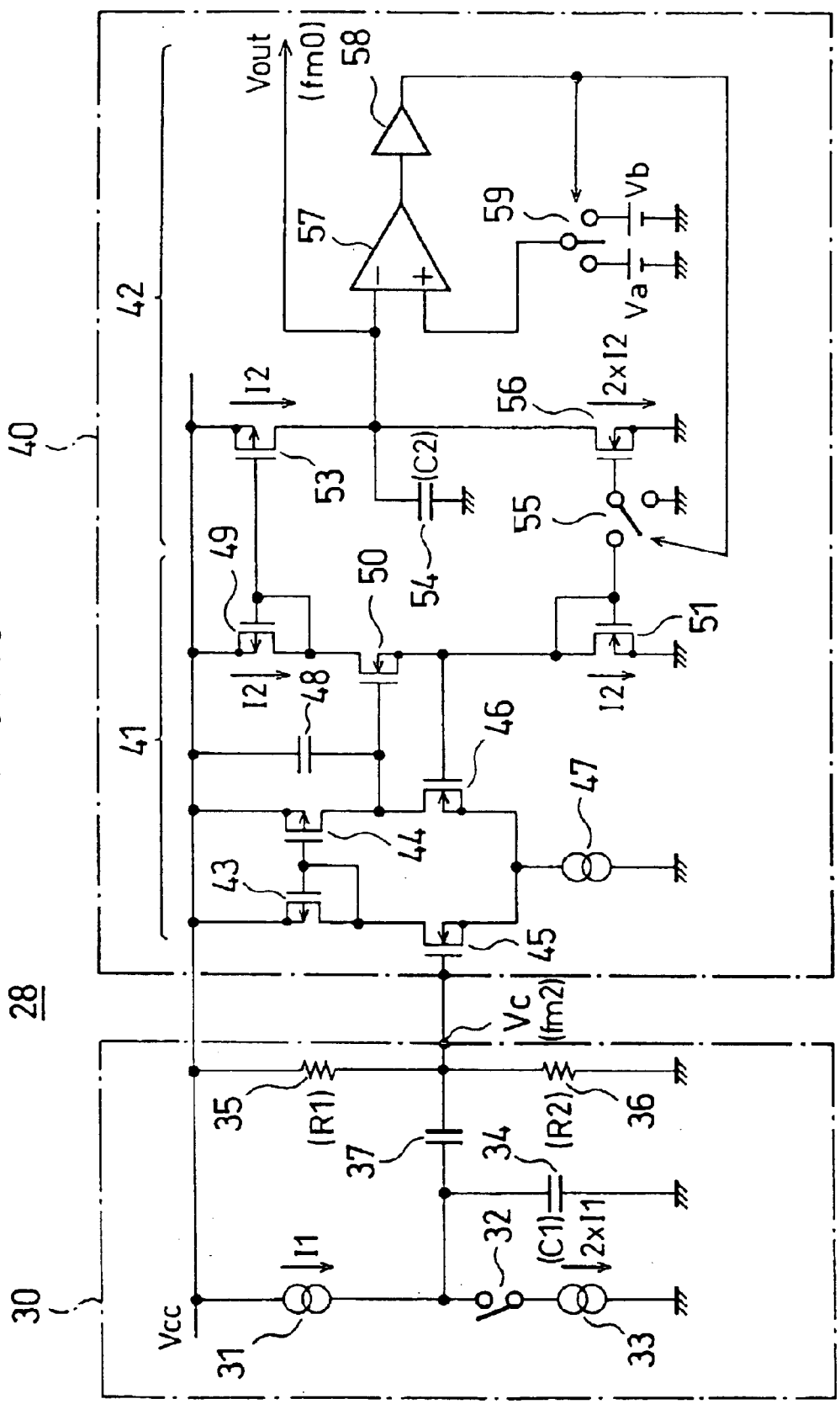
FIG. 10 is a circuit diagram of a clock modulation signal generator for doubly frequency-modulating a clock according to the invention.

Referring to FIG. 9, there is shown another embodiment of a clock generation device according to the invention. FIG. 10 shows details of the clock modulation signal generator 28 for use in the clock generation device of FIG. 9.

The clock generation device shown in FIG. 9 utilizes a PLL circuit. This device only differs from the corresponding clock generation device of FIG. 7 in that this device includes an adder 27 and a clock modulation signal generator 28 in place of the frequency division setting circuit 26 shown in FIG. 9.

In the embodiment shown herein, a clock modulation signal fm0 as shown in FIG. 5B is generated in a clock modulation signal generator 28 by frequency-modulating a first triangular wave signal having a first frequency by a second triangular wave signal having a second frequency. The clock modulation signal fm0 is then supplied to an adder 27, where the clock modulation signal is added to the output of a low-pass filter 24 to generate a voltage control signal to a VCO 25. In the VCO 25, the clock is modulated by the clock modulation signal so that a doubly frequency-modulated clock CLK is output as the Fout.

The output of the clock modulation signal generator 28 may be alternatively supplied to a voltage-variable diode provided in the VCO 25 as a voltage control signal thereto. In that event too the doubly frequency-modulated clock CLK is output from the VCO 25 as Fout.

As shown in FIG. 10, the clock modulation signal generator 28 comprises a first triangular wave generator 40 (which corresponds to the first FM signal generator 12 of FIG. 4) and a second triangular wave generator 30 (which corresponds to the second FM signal generator 13 of FIG. 4), formed of integrated MOS FETs, and generates an FM output voltage Vout (which corresponds to the clock modulation signal fm0).

The second triangular wave generator 30 includes a constant current power circuit 31 providing a current I1, a switch 32 turned ON/OFF by a control signal, and a constant current power source 33 providing a current of 2×I1, all connected in series between the voltage supply Vcc and the ground. Connected in parallel with the switch 32 and the constant current source 33 is a condenser 34 (having a capacitance C1) which outputs a triangular voltage as it is charged and discharged. Also connected in series between the voltage supply Vcc and the ground are a resister 35 having a resistance R1 and another resister 36 having a resistance R2. The node of the resisters 35 and 36 is connected to one end of the condenser 34 via a coupling condenser 37. The voltage Vc of the node (i.e. control voltage Vc) is connected with the first triangular wave generator 40. The other end of the condenser 34 is grounded.

In the second triangular wave generator 30, when the switch 32 is turned OFF, the condenser 34 is charged by the current from the constant current power circuit 31, but when the switch 32 is turned ON the constant current power circuit 33 causes the condenser 34 to discharge a constant current I1. Such repetitive charging/discharging of the condenser 34 results in successive generation of a triangular wave. The frequency fm2 of the triangular wave is determined (to be 1 kHz for example) by the frequency Fin of the input signal and the frequency division M of the first frequency divider 21. Hence, the period Tfm2 of the wave is 1/fm2. The amplitude of the triangular wave is given by I1×Tfm2/(C1×2). The triangular wave is superposed on the voltage divided by the resisters 35 and 36 to generate the control voltage Vc.

The first triangular wave generator 40 is a voltage-controlled oscillator (VCO) controlled by the control voltage Vc to vary its oscillation frequency. The VCO 40 has a constant current section 41 and an oscillator section 42 as described in detail below.

In the constant current section 41, the control voltage Vc is fed to the gate of an n-channel MOS FET (n-type FET) 45. The drain of the FET 45 is connected with the drain and the gate of a p-channel MOS FET (p-type FET) 43. The source of the FET 43 is connected with the supply voltage Vcc. The gate of the p-type FET 44 is connected with the gate of the FET 43, the source of the FET 44 with the voltage supply Vcc, the drain of the FET 44 with the gate of an n-type FET 50 and the drain of an n-type FET 46.

The sources of the FET 45 and 46 are connected with one end of a constant current source circuit 47 which is grounded at the other end. The drain of the FET 50 is connected with the drain and the gate of a p-type FET 49. The source of the FET 49 is connected with the voltage supply Vcc. The source of the FET 50 is connected with the gate of the FET 46 and to the drain and the gate of the n-type FET 51. The source of the MOS FET 51 is grounded. Connected between the gate of the FET 50 and the voltage supply Vcc is a condenser 48 for preventing oscillations.

In the oscillator section 42, the gate of a p-type FET 53 is connected with the gate of the FET 49, and the source of the FET 49 is connected with the voltage supply Vcc. The drain of the FET 49 is connected with one end of a condenser 54, the drain of an n-type FET 56, and the inversion terminal (negative terminal) of a comparator 57. The other end of the condenser 54 is grounded.

The source of the FET 56 is also grounded, with the gate connected with a switching element 55. The switching element 55 can be a MOS FET for example for performing switching operation to ground the gate of the FET 56 or to connect the gate with the gate of a MOS FET 51. The switching element 55 is controlled by the output of a buffer 58.

The non-inverting terminal (positive terminal) of the comparator 57 is connected with another switching element 59. The switching element 59 is controlled by the output of the buffer 58 to apply a reference voltage Va or a reference voltage Vb lower than Va to the positive (non-inverting) terminal of the comparator 57.

The charged voltage of the condenser 54 is output from the first triangular wave generator 40 as the output voltage Vout.

The input section of the constant current section 41 is constructed in the form of feedback buffer. That is, the FET 43 and FET 44 form a pair of current mirror circuits so that a current is fed back from the drain of the FET 46 to the gate thereof via the FET 50. Accordingly, under the control of the voltage Vc, current I2 flows through the MOS FETs 49 and 51.

The FETs 49 and 53 (presumably having the same area) together form a pair of current mirror circuits so that an output current I2 flows through the FET 53. On the other hand, when the gates of the FETs 51 and 56 are connected with each other by the switching element 55, the two FETs form a pair of current mirror circuits, which allows an output current 2×I2 to flow through the FET 56, provided that the FETs 53 and 56 are configured to satisfy the mirror condition.

When a high level signal is output from the buffer 58, the switching element 55 grounds the gate of the FET 56, so that the switching element 59 causes the reference voltage Va to be supplied to the non-inverting (positive) terminal of the comparator 57. Then the FET 56 is turned off to charge the condenser 54 by the current I2 supplied from the FET 53. As the voltage of the condenser 54 rises above the reference voltage Va, the comparator 57 generates a low-level signal.

As a result, buffer 58 generates a low-level signal, and the switching element 55 connects the gate of the FET 56 with the gate of the FET 51, while the switching element 59 couples the reference voltage Vb with the non-inverting (positive) terminal of the comparator 57. The reference voltage Vb is lower than the reference voltage Va. As the current 2×I2 flows through the FET 56, current I2 causes the condenser 54 to be discharged.

As the voltage of the condenser 54 decreases below the reference voltage Vb, the comparator 57 generates a high level signal, which causes the buffer 58 to generate a high-level signal to switch the conditions of the switching element 55 and 59 to thereby re-charge the condenser 54, as described previously.

Such repetitive charging and discharging causes the condenser 54 to successively generate a triangular wave voltage Vout. When the control voltage Vc had a constant value, the frequency fm0 of the triangular wave would reduce to a constant frequency fm1 defined by I2/(2×C (Va−Vb), which would turn out to be something like 15 kHz in a specific example.

It is noted that a clock modulation signal generator 28 of the invention comprises a first triangular wave generator 40 and a second triangular wave generator 30 generating a second triangular control voltage Vc of frequency fm2 (e.g. 1 kHz), and that the second triangular control voltage Vc is fed to the first triangular wave generator 40 as the voltage-control signal thereto. Consequently, the output voltage of the first triangular wave generator 40, Vout, having a constant frequency (e.g. 15 kHz) is frequency-modulated by the second triangular wave signal, resulting in a doubly frequency-modulated triangular wave signal fm0.

Since the clock is doubly frequency-modulated in the VCO 25 by the frequency-modulated triangular wave signal fm0 output from the clock modulation signal generator 28, the resultant output signal Fout is doubly frequency-modulated accordingly.

What is claimed is:

1. A clock generation device, comprising:
    a clock generator for generating a clock having a predetermined frequency, said clock generator adapted to receive a frequency modulation (FM) signal;
    a modulation signal generator for generating a clock modulation signal by generating a first and a second FM signals having a first and a second frequencies, respectively, and by frequency-modulating said first FM signal by said second FM signal, wherein
        said clock modulation signal is supplied to said clock generator to thereby frequency-modulate said clock to generate a doubly frequency-modulated clock having a range of frequencies, and wherein
        wherein said clock generator is a phase-locked loop (PLL) circuit having a variable frequency-divider, and wherein said clock modulation signal is applied to said variable frequency divider.

2. An electronic apparatus having a clock generation device which includes
    a clock generator for generating a clock having a predetermined frequency, said clock generator adapted to receive a frequency modulation (FM) signal;
    a modulation signal generator for generating a clock modulation signal by generating a first and a second FM signals having a first and a second frequencies, respectively, and by frequency-modulating said first FM signal by said second FM signal; wherein
        said clock modulation signal is supplied to said clock generator to thereby frequency-modulate said clock to generate a doubly frequency-modulated clock which has a range of frequencies not affecting the operations of said electronic apparatus and serves as a time base of said electronic apparatus, and
        wherein said clock generator is a phase-locked loop (PLL) circuit having a variable frequency-divider, and wherein said clock modulation signal is applied to said variable frequency divider.

* * * * *